(12) United States Patent
Christian et al.

(10) Patent No.: US 8,635,195 B2
(45) Date of Patent: Jan. 21, 2014

(54) INDEX COMPRESSION IN A DATABASE SYSTEM

(75) Inventors: Andreas Christian, Karlsruhe (DE); Joern Klauke, Petersberg (DE); Edgardo G. Koenig, Leimen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/445,296

(22) Filed: Apr. 12, 2012

(65) Prior Publication Data

US 2012/0296881 A1 Nov. 22, 2012

(30) Foreign Application Priority Data

May 19, 2011 (EP) ..................................... 11166642

(51) Int. Cl.
*G06F 17/00* (2006.01)
(52) U.S. Cl.
USPC .......................................................... 707/693
(58) Field of Classification Search
USPC ................... 707/696, 715, E17.049, E17.085
See application file for complete search history.

(56) References Cited

U.S. PATENT DOCUMENTS

| 7,653,643 B2 | 1/2010 | Livshits |
| 2002/0010701 A1* | 1/2002 | Kosciuszko et al. .......... 707/100 |
| 2010/0082545 A1 | 4/2010 | Bhattacharjee et al. |

OTHER PUBLICATIONS

Expert Indexing in Oracle Database 11g: Maximum Performance for your Database by Darl Kuln, Sam R. Alapati, and Bill Padfield, Apress, Dec. 21, 2011.*
It's Less Efficient to Have Low Cardinality Leading Columns in an Index (Right)?, http://richardfoote.wordpress.com/2008/02/13/its-less-efficient-to-have-low-cardinality-leading-columns-in-an-index-right/, Feb. 13, 2008.*

* cited by examiner

*Primary Examiner* — Robert Beausoliel, Jr.
*Assistant Examiner* — Hau H Hoang
(74) *Attorney, Agent, or Firm* — Cantor Colburn LLP; Elissa Wang

(57) ABSTRACT

A method for compressing index pages in a database system is provided. The database system includes a table, and the table includes table columns. The method includes: providing an index associated with the table, wherein the index is stored on at least one index page of the database system, and wherein the index comprises index columns related to a part of the table columns; providing a first sequence of the index columns; providing a second sequence of the index columns; arranging the index columns stored on the at least one index page according to the second sequence; performing a prefix compression on entries of the at least one index page; and accessing the index using the first sequence of the index columns.

11 Claims, 7 Drawing Sheets

INDEX COMPRESSION IN A DATABASE SYSTEM

PRIORITY

The present application claims priority to European Patent Application No. 11166642.6, filed on 19 May 2011, and all the benefits accruing therefrom under 35 U.S.C. §119, the contents of which in its entirety are herein incorporated by reference.

BACKGROUND

The present invention relates generally to a method for compressing index pages in a database system as well as to an index compression converter.

Today, the amount of data stored and processed by database systems is growing at an accelerating pace. In parallel, demand for a more optimized manner of storing the growing amount of data increases, which essentially means that users expect to store more data in the same amount of space, for example by using compression techniques.

An increase in data volume means an increase in storage capacity, driving up storage costs as well as operational costs due to higher power requirements. The cost for electricity may be one of the biggest expenses in a data center. With the number of hard disks used (and the hard disk price also increases with higher access speed), the costs for electric power increase. Therefore, companies struggle with rising costs in respect to their data centers.

In relational databases, indexing tables with keys, including primary and secondary keys, is a common technique in order to improve access time to data. However, additional indexes also mean more required storage space on hard disks. The existence of indexes may also have the advantage that reading complete table entries may not be required if the data searched for in a table is already contained in an index. Whether or not to define one or more columns as an index on a table is a critical design criterion for a specific database. A user may find and define the best perceived compromise between access speed and additional required hard disk space.

One option to save hard disk space may be an index compression, in particular prefix compression. Common prefix compression is a compression technique that may be used to reduce the size of indexes. In case multiple index entries of a compound index have the same prefix, this prefix may only be stored once in a header of an index page.

On the other side, for performance reasons, it is recommended to use columns with the largest amount of distinct values as the leading columns in an index.

One problem with such an ordering may be that this column order (high cardinality columns first) may drastically reduce potential space savings provided by common prefix compression.

Several approaches to index compression in relational databases are known. U.S. Patent Publication No. US2010/0082545 discloses a method, an information processing system, and a computer program storage product for compressing sorted values. At least a first prefix and a second prefix in a plurality of prefixes are compared. Each prefix comprises at least a portion of a plurality of sorted values. A respective prefix comprises a set of consecutive characters including at least a first character of a respective sorted value. The respective sorted value further comprises a respective suffix comprising consecutive characters of the respective sorted value following the respective prefix. At least a respective first character of the first prefix and a respective first character of the second prefix are determined to be substantially identical. The first prefix is merged with the second prefix into a single prefix comprising the first character. A set of suffixes associated with the first prefix is updated to reflect an association with the second prefix.

In U.S. Pat. No. 7,653,643, another compression method is disclosed. A configuration management system uses a data compression method to compress entries in a data set. An entry is selected as a prefix value and prefix compression of the data set is performed. The entry to serve as the prefix value is quickly selected using an iterative approach. In each iteration, subgroups of entries are formed from groups formed in prior iterations based on the values of characters at successive positions in the entries. The approach is readily implemented using data structures represented as lists.

BRIEF SUMMARY

In one aspect, a method for compressing index pages in a database system is provided. The database system includes a table, and the table includes table columns. The method includes providing an index associated with the table, wherein the index is stored on at least one index page of the database system, and wherein the index comprises index columns related to a part of the table columns; providing a first sequence of the index columns; providing a second sequence of the index columns; arranging the index columns stored on the at least one index page according to the second sequence; performing a prefix compression on entries of the at least one index page; and accessing the index using the first sequence of the index columns.

In another aspect, a computer program product for compressing index pages in a database system is provided. The database system includes a table, and the table includes table columns. The computer program product includes a computer readable storage medium having computer readable program code embodied therewith. The computer readable program code includes computer readable program code configured for providing an index associated with the table, wherein the index is stored on at least one index page of the database system, and wherein the index comprises index columns related to a part of the table columns; providing a first sequence of the index columns; providing a second sequence of the index columns; arranging the index columns stored on the at least one index page according to the second sequence; performing a prefix compression on entries of the at least one index page; and accessing the index using the first sequence of the index columns.

In another aspect, an index compression converter for compressing index pages in a database system is provided. The database system includes a table, and the table includes table columns. The index compression converter includes: an index providing unit adapted for providing an index associated with the table, wherein the index is stored on at least one index page of the database system, and wherein the index comprises index columns related to the table columns; a first providing unit adapted for providing a first sequence of the index columns; a second providing unit adapted for providing a second sequence of the index columns; an arranging unit adapted for arranging the index columns stored on the at least one index page according to the second sequence; a compression unit adapted for carrying out a prefix compression on entries of the at least one index page; and an accessing unit adapted for accessing the index using the first sequence of the index columns.

BRIEF DESCRIPTION OF THE SEVERAL VIEWS OF THE DRAWINGS

The drawings referenced in the present application are only used to exemplify typical embodiments of the present invention and should not be considered to be limiting the scope of the present invention.

DETAILED DESCRIPTION

Figure 1:
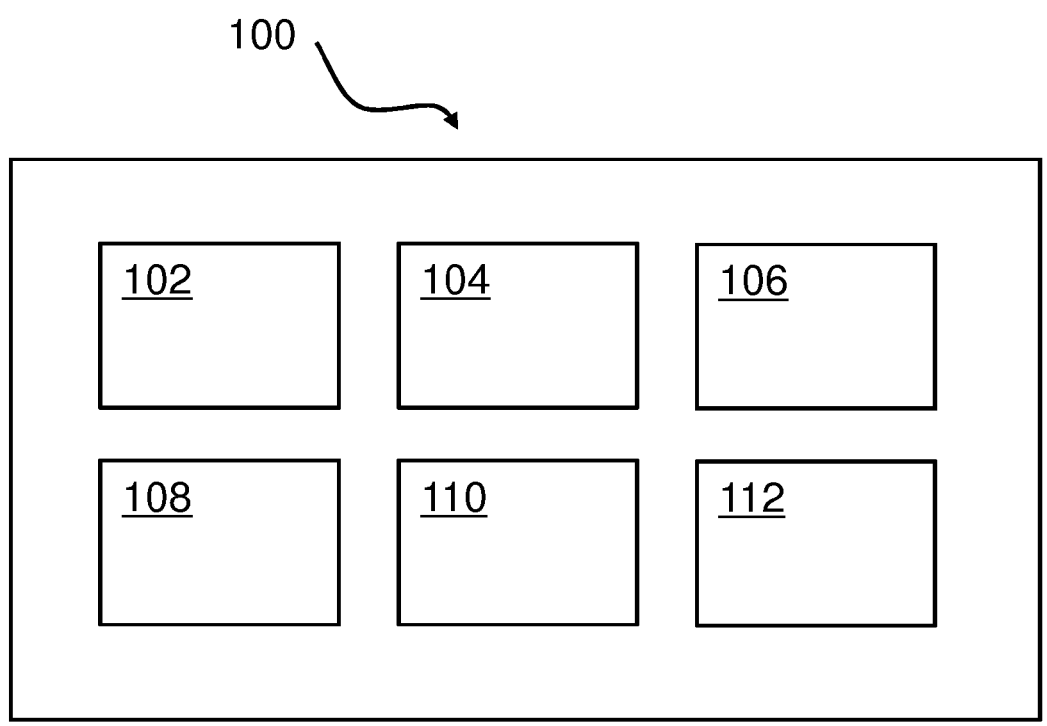
FIG. 1 shows a block diagram of an embodiment of the inventive method.

A method for compressing index pages in a database system, an index compression converter, a database system, a computer system, a data processing program, and a computer program product are provided, with exemplary embodiments being discussed below in detail. Embodiments provide an improved method of prefix compression in databases, in particular for reducing space required for index pages. In the discussion below, the following conventions have been followed:

Database system—A database system may denote any database management system accessing data by so-called storage pages. Storage pages may denote an area on a storage medium with a predefined size, i.e., a predefined amount of storage capacity. A page may comprise one or more records, i.e., rows of the table or an index, wherein the total number of entries on a storage page may depend on an entry length and whether or not the page is fully used. Because of a reference to columns and rows made in the context of this application, in general, a relational database may be used as database system. Thus, records may be access by indexes, e.g., in the form of primary or secondary keys defined for a table. However, the application is not limited to such a database organization.

Cache—A cache may denote a storage area in a RAM (random access memory) of a computer system. It may allow much faster data access than access to data being stored on a long term storage such as a hard disk drive. While data may be in the cache, applications accessing the stored data may access the data via the cache, e.g., in form of a row or a record. The last two terms may be used as synonyms in the context of this application. The cache may also be named buffer pool.

Accessing information—The term access or, accessing information or data, in particular a record in a database, may denote a read access, an insert access, a modify or update access.

SQL—The term SQL may denote a standard "structured query language" for managing data in a relational database system. Several dialects are known: SQL-86, SQL-89, SQL-92, SQL:1999, SQL:2003 or SQL:2008. The SQL language may have a predefined set of language constructs, e.g., a CREATE TABLE statement, a CREATE INDEX statement or, a TIMESTAMP statement.

Cardinality—In SQL, the term cardinality may denote the number of distinct data values contained in a particular column (attribute) of a database table. The lower the cardinality, the more duplicated elements may be available in a given column. Thus, a column with the lowest possible cardinality would have the same value for every TOW.

Embodiments of methods for handling storage pages in a database system may offer various advantages. For example, the index compression converter may allow a better compression of indexes and thus, a better usage of available disk space. In a conventional database design, for performance reasons, it may be recommended to use the columns with the largest amount of distinct values as the leading columns in the index, i.e., table columns defined as index for a table with the largest cardinality may be used as first columns of an index. However, a problem may be that such a column sequence ("high cardinality columns first") may drastically reduce the potential space savings provided by conventional prefix compression. In order to maximize space savings with conventional prefix compression, the leading columns in the index may be those with the lowest number of distinct values, i.e., with the lowest cardinality. A separate definition of a second sequence of index columns in comparison to the conventionally used index columns may be provided. It may allow maximizing the compression savings due to common prefix compression by physically storing low cardinality index columns in the first positions of an index, but using another sequence of index columns used to specify the sort order of index entries in the index (logical order) as in conventionally database designs.

Hence, the definition of an index may be extended, so that a user may specify a logical and a physical sequence of index columns, in particular in a CREATE INDEX statement. Although, such an extension may not have the same effect as changing completely the sequence of the index columns, this extension may help to achieve a better compression ratio, when a prefix compression technique may be used.

In one embodiment, at least one index page may be stored on a long term storage medium. This may be a hard disk, a solid state disk, a RW DVD, a rewritable Blu-Ray™ disk or any other long term storage medium. It may keep the data even if a power supply of the device may be switched off.

In another embodiment, at least one index page, in particular a part thereof, may be transferred from a long term storage medium to a cache, in particular a buffer pool, in main memory of a computer system before the index may be accessed. Cache storage allows for a much faster access to data compared to an access to the same data on the long term storage device.

In yet another embodiment, the transferring of the at least one index page from the long term storage medium to the cache may comprise arranging the index columns according to the first sequence of the index columns such that the index columns are stored in the cache according to the first sequence of the index columns. Such a conversion may be named immediate conversion mode because a re-arranging between a physical sequence of the columns on the hard disk and a logical sequence may be performed immediate at the time the relevant data may be transferred from the long term storage device to a cache.

In an alternative embodiments, the accessing of the index may comprise arranging the index columns according to the first sequence of the index columns such that entries of the index may be accessed using the first sequence of the index columns. Such a conversion may be named late conversion mode because the conversion may—in this case—not be performed when copying data from the long term storage device to the cache but only when the data in the cache may be accessed. It may be implemented in a way that the index columns sequence may be converted to the first sequence and copied to another main memory area. However, the sequence of the index columns in the cache or buffer pool, and on the hard disk, may be identical.

However, given the current context of accessing data using two different sequences of index columns, a skilled person will immediately understand the requirement of converting an index columns sequence from a first sequence to a second sequence before the index columns may be written to the long term storage medium. Thus, a prefix or index compression converter may be required to perform the conversion on both ways: from the hard disk drive to the cache, and vice versa. This may be valid for an immediate and a late conversion mode. Or, in other words: In both situations, when the page from memory or cache may need to be written back to a disk because it may have been marked dirty and the place used by the page that may have to be freed up, the index columns sequence page may be converted to its physical representation again, i.e., the second sequence.

In another embodiment, the second sequence of the index columns may be determined based on data being stored in the table. A bulk load of data to the table may be performed and then an index, as predefined, may be generated. Such a sequence of index columns may be based on statistical data being available from the data that have been bulk loaded. Other loading mechanisms may be possible. It may, e.g., be the case that a different index may be defined for a given table in the database system. The index creation may analyze the cardinality of the data in the table columns defined as index columns and eventually store the index columns according to the second sequence in order to allow for a consequent and optimized prefix compression. Such a process may also be performed during a reorganization process of a database system. As a result, the index column with the lowest cardinality may be stored as first index column of a given index.

In another embodiment, the providing of the second sequence of index columns may comprise defining the second sequence of the index columns in a modified CREATE INDEX statement of a structured query language. Such a feature may enable an easy to understand option for defining a first sequence of columns—the conventional sequence, which may define a sort order of the index entries in the index—and a physical—the new—storage order, which may define how the index columns are physically stored, i.e. a column storage sequence, in an SQL statement known by programmers.

In another embodiment, there may be a case in which a new row is inserted into the table. In such a case, a new index entry into the index associated with the table may be inserted using the first sequence of the index columns. Thus, the column storage sequence of the index may be transparent to the user or administrator of the database because an insert may be performed according to the first sequence of columns of the relevant index.

In another embodiment, the second sequence of the index columns may be determined such that the index column with the lowest cardinality may be the first column of the index columns, in particular such that the columns may be sorted by cardinality starting with the column having the lowest cardinality. As mentioned above, such a sequencing may allow for a good prefix compression.

Furthermore, a computer or computer system may comprise an index compression converter, as described above, for compressing index pages in a database system. The index compression converter may also be implemented as a component of a database system, which may be part of a computer system.

It should be noted that embodiments may take the form of an entire hardware implementation, an entire software embodiment or, an embodiment containing both, hardware and software elements. Various embodiments may be implemented in software, which includes, but is not limited to, firmware, resident software and microcode.

In another embodiment, a data processing program for execution in a data processing system is provided comprising software code portions for performing the method, as described above, when the program is run on a data processing system. The data processing system may be a computer or computer system.

Furthermore, various embodiments may take the form of a computer program product, accessible from a computer-usable or computer-readable medium providing program code for use, by or in connection with a computer or any instruction execution system. For the purpose of this description, a computer-usable or computer-readable medium may be any apparatus that may contain means for storing, communicating, propagating or transporting the program for use, by or in a connection with the instruction execution system, apparatus, or device.

The medium may be an electronic, magnetic, optical, electromagnetic, infrared or a semi-conductor system for a propagation medium. Examples of computer-readable mediums include computer-readable storage mediums such as a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

Various embodiments have been described with reference to different subject-matters. In particular, some embodiments have been described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular between features of the method type claims, and features of the apparatus type claims, is considered as to be disclosed within this document. The aspects defined above are apparent from the examples of embodiments to be described hereinafter and are explained with reference to examples of various embodiments.

In the following, a detailed description of the figures will be given. All illustrations in the figures are schematic. Firstly, a block diagram of a method for compression index pages in a database system is described. Afterwards, embodiments of the method and an index compression converter will be described.

FIG. 1 shows a block diagram of an embodiment of the inventive method 100 for compressing index pages in a database system. The database system may comprise a table, wherein the table may comprise table columns. The method may comprise providing an index associated with the table 102, wherein the index is stored on at least one index page of the database system, and wherein the index may comprise index columns related to a part of the table columns, providing a first sequence of the index columns 104, and providing a second sequence of the index columns 106. Furthermore, the method may comprise arranging the index columns stored on the at least one index page according to the second sequence 108, carrying out a prefix compression on entries of the at least one index page 110, as well as accessing the index using the first sequence of the index columns 112.

Figure 2:
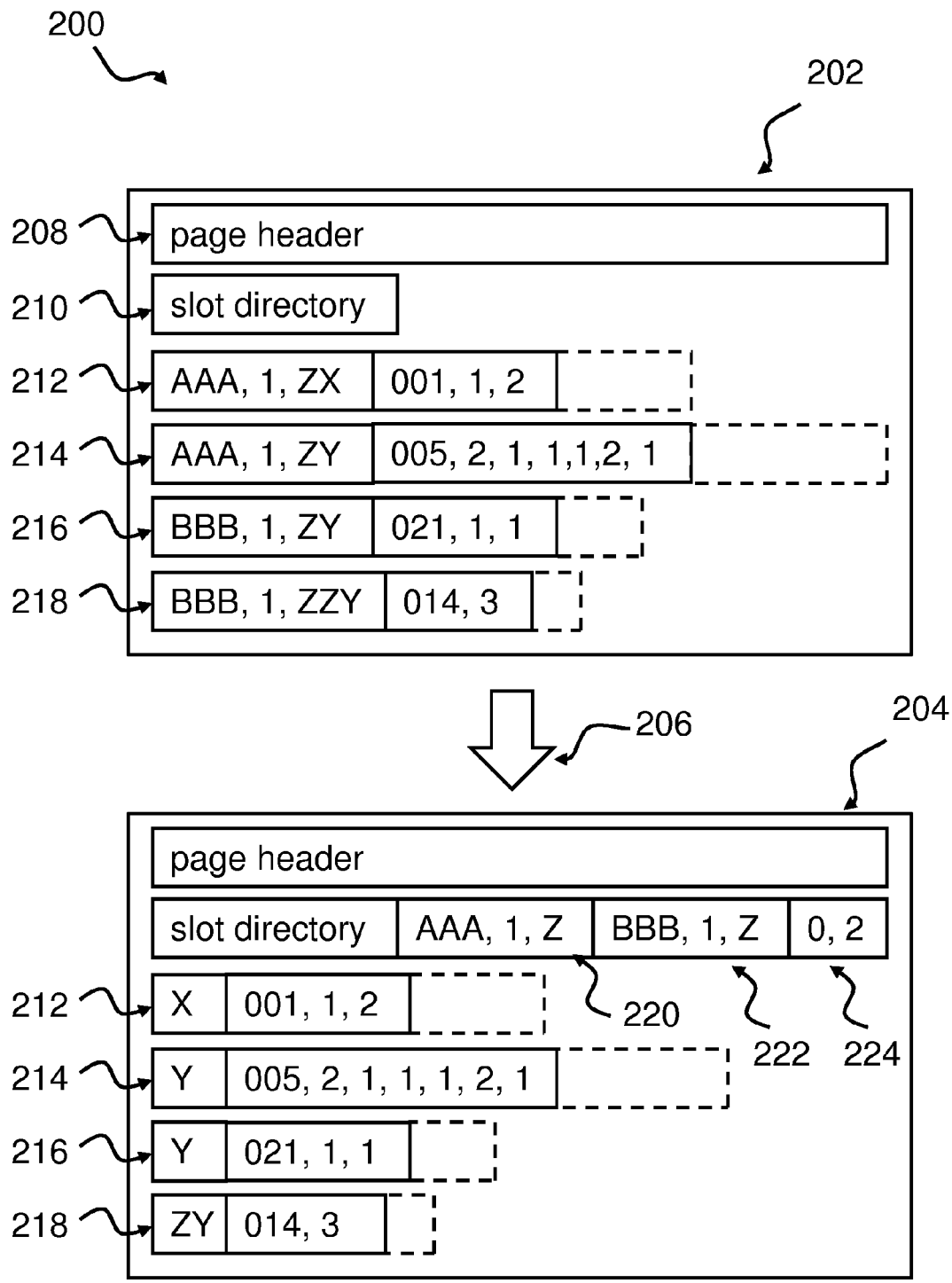
FIG. 2 shows a block diagram of an embodiment of a conventional prefix compression technique.

FIG. 2 shows a block diagram 200 of a conventional prefix compression technique. An index page 202 in an uncompressed form and an index page 204 in a prefix-compressed form may be recognizable. Arrow 206 may show the transition from an uncompressed form to a compressed form. The uncompressed index page may comprise a conventional page header 208 and a conventional slot directory 210. Additionally, the page 202 may comprise four index entries or 212, 214, 216, 218. Each index entry may show the indexed values and the row identifiers (RIDs), which may be seen as pointers to the records/rows having these indexed values in data pages of the database system. As shown, the index page 202 may comprise two sections per index record 212, 214, 216, 218. The first section may, record by record, comprise the fields with the content "AAA, 1, ZX", "AAA, 1, ZY", "BBB, 1, ZY" and BBB, 1, ZZY", which may be the indexed values. The respective second section entries may comprise the following content "001, 1, 2", "005, 2, 1, 1, 1, 2, 1", "021, 1, 1" and "014, 3", which are the representation of the RIDs. Thus, each index page entry may require the full length of the record. No compression may be performed.

In contrast to this, the index page 204 may show the entries in a compressed form. Common elements of the index records 212, 214, 216, 218 may be extracted to fields 220 and 222. Field 220 may contain "AAA, 1, Z" because these elements may be identical to the content of the first section of the records 212 and 214. Field 222 may contain "BBB, 1, Z" because these elements may be identical to the content of the first section of records 216 and 218. Additionally, a field 224 may have been added. This field may contain a reference to the rows of index records referring to the entry in the list of index records where the first prefix 220 and the prefix 222 may start. In the shown embodiment, the first prefix 220 may relate to the first record 212. Consequently, a combination of the content of prefix compression field 220 and the content of the first field 212 of the index page 204 may result in the original content of the first record field 212 of the related uncompressed index page 202.

In a similar way, fields 222, 224 and index records 216 and 218 may be linked to each other. Field 222 may comprise an index part that may appear in several index records, e.g., records 216 and 218. The second entry in field 224 may define which of the records in the list of index records may be the first to which the content of the field 222 may relate to. Such a system may be extended to many more prefix compress fields 220, 222. In such a case, the field 224 may contain as many entries as there may be prefix compression fields 220, 222.

Conventionally, the first field or the first column of an index may be selected according to its cardinality. For performance reasons it may be advantageous having the column with the highest cardinality as first column. A consequence may be that the compression ratio of index pages may be low.

The following may explain the gist of the index page compression technique in more detail. A table "mytable" with the following content may be given:

TABLE 1

| RID | COL0 | COL1 | COL2 | DESCRIPTION |
|---|---|---|---|---|
| 1 | b | b | b | Bon jour |
| 2 | c | b | b | Buon giorno |
| 3 | a | a | a | Guten Tag |
| 4 | c | a | a | Good morning |
| 5 | b | a | a | Buenos días |

"RID" stands for record or row identifier, and "COL0" for the first column of table "mytable", "COL1" for the second column and so on. The row identifier may be shown to understand the example. This column may not be created explicitly, but it may be needed by the database system to be able to locate a given record or row.

A related CREATE INDEX statement may be: "CREATE INDEX ix_mytable ON mytable (COL0, COL1, COL2)". A corresponding index may comprise the following:

TABLE 2

| Index Key Position | COL0 | COL1 | COL2 | Data-RID |
|---|---|---|---|---|
| $1^{st}$ | a | a | a | 3 |
| $2^{nd}$ | b | a | a | 5 |
| $3^{rd}$ | b | b | b | 1 |
| $4^{th}$ | c | a | a | 4 |
| $5^{th}$ | c | b | b | 2 |

The column "Index Key Position" in table 2 may be mentioned only for comprehensibility reasons—technically, it may not be required at all. If the index prefix compression technique, as discussed above may be used, for the previous data there may be no chance to identify any prefix with more than one column to compress.

Figure 3:
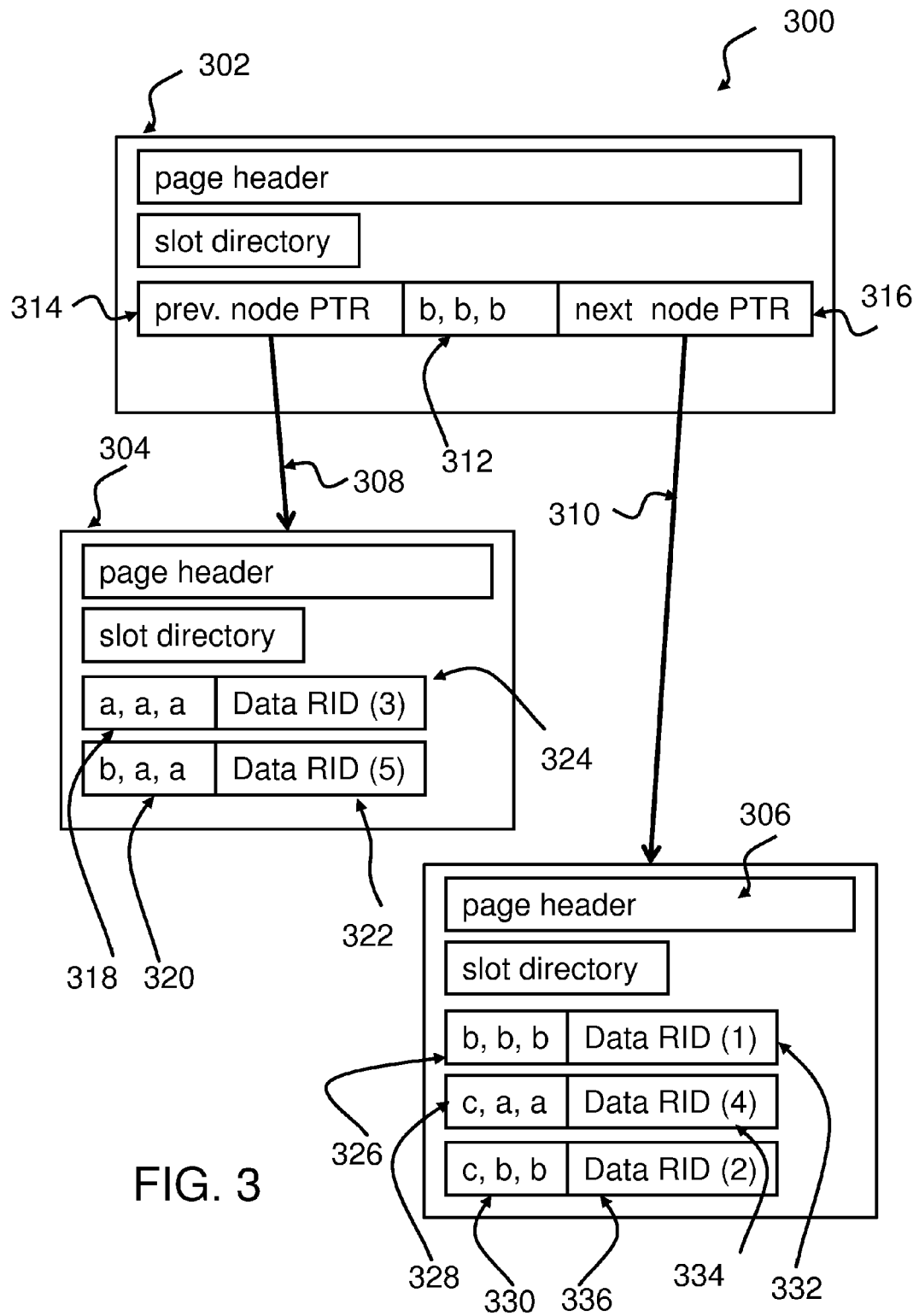
FIG. 3 illustrates an embodiment of an exemplary index tree without prefix compression.

In case an index page may contain at most three entries, a complete index structure may look like the index tree 300 of FIG. 3. Three index pages 302, 304, 306 may be required. The "page header", "slot directory" may be unchanged if compared to FIG. 2. The entry "prev. node PTR" may denote a previous node pointer 314 as known from conventional index trees. It may point to a previous page, as indicated by arrow 308.

"Next node PTR" may represent a pointer 316 to the next index page 306 as indicated by arrow 310. Field 312 may represent the splitting index entry between the previous index page 304 and the next index page 306. It may be clear that "b, b, b", as indicated by arrow 326, may represent the three index columns of table 2, index key position $3^{rd}$, RID 1. Hence, the index tree 300 may represent the content of index table 2 completely.

The previous index page 304 may comprise entries 318/324 and 320/322 of the index table, whereas next index page 306 may comprise the entries 326/332, 328/334 and 330/336 as can be seen in FIG. 3.

It may be obvious that no prefix compression may be possible for the index pages 302, 304, 306 of the index tree 300. However, if table 2 would be represented and stored in the form of table 3, prefix compression may be possible. It may be noted that rows and fields with lower left to upper right stripes, tuple (a, a), may undergo a prefix compression. In the same way, rows and fields with upper left to lower right stripes, tuple (b, b), in table 3 may also undergo a prefix compression.

TABLE 3

| Index Key Position | COL2 | COL1 | COL0 | Data-RID |
|---|---|---|---|---|
| $1^{st}$ | a | a | a | 3 |
| $2^{nd}$ | a | a | b | 5 |
| $3^{rd}$ | b | b | b | 1 |
| $4^{th}$ | a | a | c | 4 |
| $5^{th}$ | b | b | c | 2 |

It may also be noted that—apart from exchanging the sequence of the index columns—nothing may have been changed if compared to table 2. Only the prefix (a, a) and (b, b) may be replaced by their corresponding slot dictionary compression entries. Therefore, the overall compression of the index may be better than with the previous conventional procedure.

Figure 4:
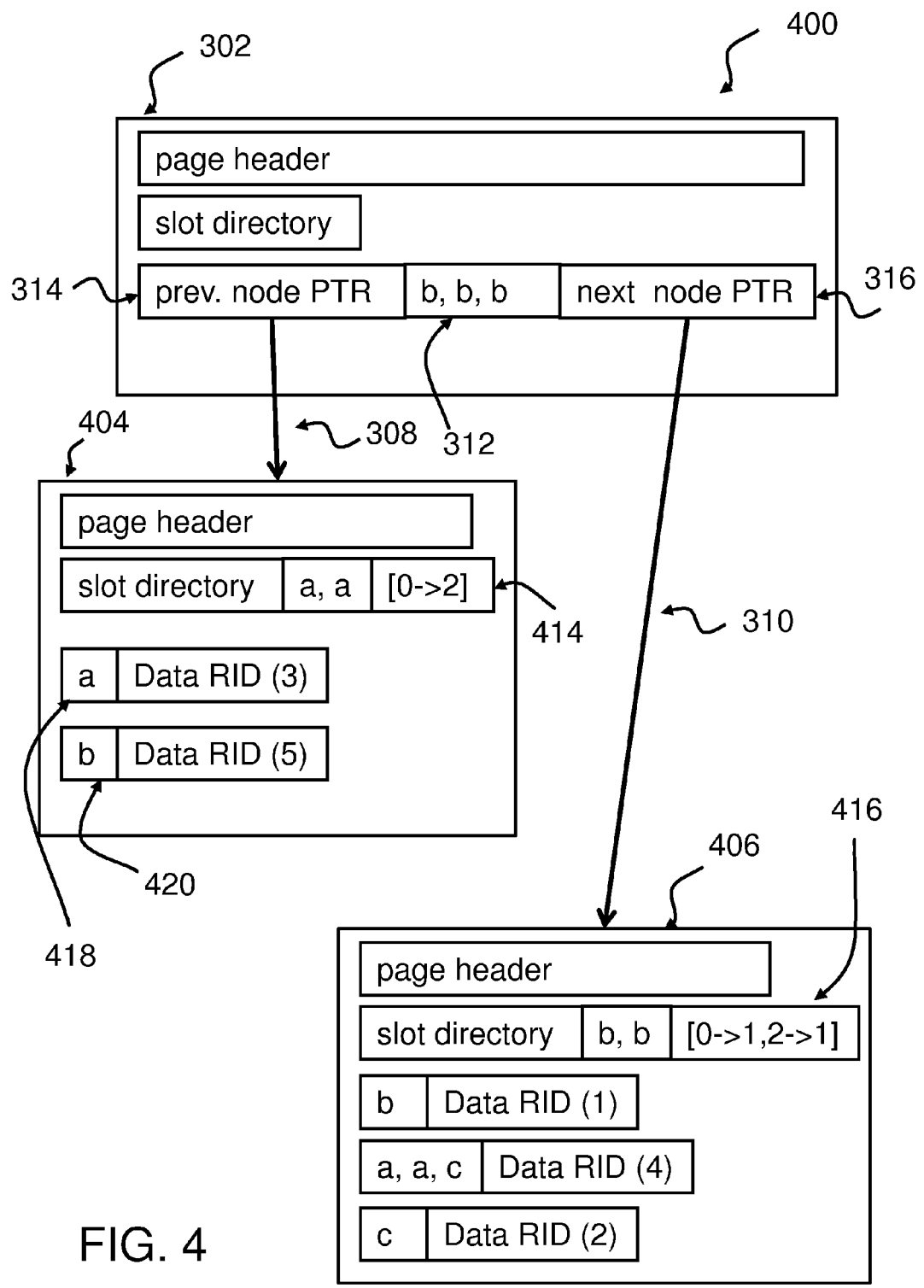
FIG. 4 shows an embodiment of an exemplary index tree with a prefix compression using the second sequence of index columns, i.e., column storage sequence.

In such changed scenario, the modified complete index 400 with a compression technique may be illustrated in FIG. 4. Index page 302 and its content may not be changed at all because there may only be one index entry. In case several index entries may be present, also here a prefix compression may be possible.

Moreover, the RID of the records of index page 404 and 406 may not be changed if compared to the corresponding index pages of FIG. 3. However, now it may be possible to compress prefixes of the index entries. In case of index page 404, a prefix "a, a" representing COL2 and COL1 of table 3 may be extracted from the individual records. A combined offset "[0→2]", field 414, 416 may reference to the index records for which the prefix compress may be applicable as explained above. On index page 406, a combined offset "[0→1, 2→1]" may be used. The combined offset composition may be defined as "[n→m]", wherein "n" identifies which is the index entry, where the common prefix will firstly apply, and "m" may provide the number of successive index entries having the same common prefix.

Fields 418, 420 may comprise the remaining and differentiating part of the index entry. Additionally, it may be noted that also index page 302 as non-leaf page may undergo a prefix compression. The conversion from the prefix compressed mode to the uncompressed mode—which may also be related to a change of the sequence of the columns of the index page—may be done at two different times: an immediate conversion or a late conversion.

Figure 5:
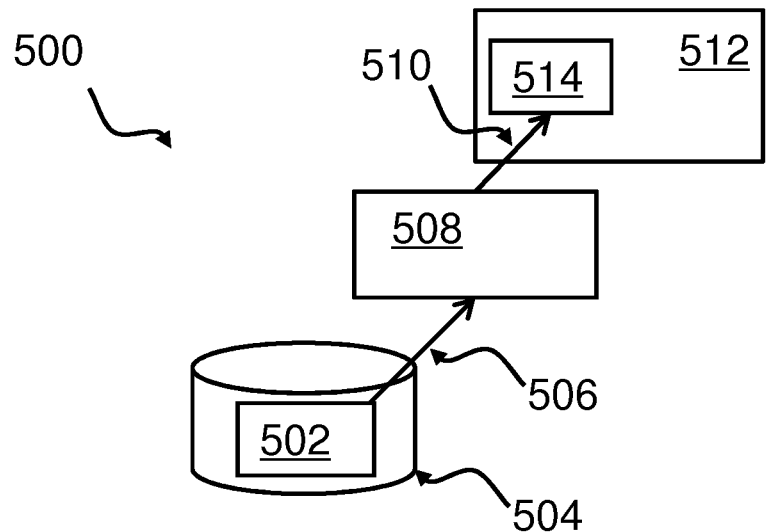
FIG. 5 shows a block diagram of an embodiment for the case of immediate conversion.

FIG. 5 may illustrate the case of an immediate conversion 500. An index page 502 stored on a hard disk 504 in a database system may be transferred—indicated by arrows 506, 510 by a prefix compression converter 508—to a cache 512. The cache may be a part of the main memory of the computer or may be a separate memory area typically implemented as RAM. The index page 514 may be related to the index page 502 with the difference that index page 514 may comprise the index columns in the logical or first sequence while the index page 502 may comprise that same index columns in a physical storage order or second sequence. This may allow prefix compression such that storage space on the hard disk 504 may be saved. For higher layers of the database system it may not be "visible" that the index page columns may be stored in a different way or sequence on a long term storage medium like a hard disk.

The same may apply for higher layers of the database system and write backs from the cache to the long term storage medium. The process may be transparent for the higher layers. The index compression converter may handle the rearranging of index columns automatically.

Figure 6:
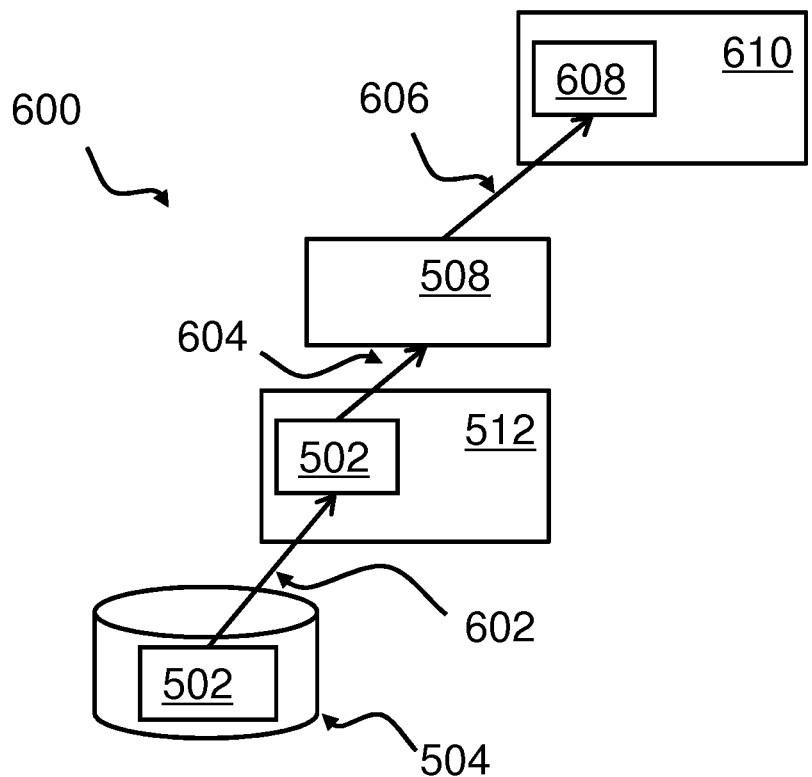
FIG. 6 shows a block diagram of an embodiment for the case of late conversion.

In case of a late conversion 600, FIG. 6, the index page 502 is in a conventional way copied—indicated by arrow 602—from the hard disk 504 to the cache 512. The sequence of the columns of the index page 502 on the hard disk and the cache may be identical and still in the physical or second sequence.

In case the index page may be accessed by higher layers of the database system, a conversion from the physical or second sequence to the logical or first sequence may be required. The prefix compression converter 508 may then—during executing an access command to the index—convert the sequence of columns of the index page 502 in the cache 512 to the required first sequence of index columns in another area of the main memory 610. The two arrows 604 and 606 to and from the prefix converter 508 may illustrate such an index page movement including a conversion. Index page 608 may now comprise the first sequence of index columns for further processing. Here again, for higher layers of the database system, such a conversion may be transparent, i.e., invisible.

A combination of the two different conversion modes may also be implemented. For example, non-leaf pages of the index may be placed in memory without any conversion; only when the pages may need to be changed, the conversion may take place from the column storage sequence or second sequence to the first sequence of index columns. The leaf pages may be placed in main memory after its conversion from a physical to logical representation.

Figure 7:
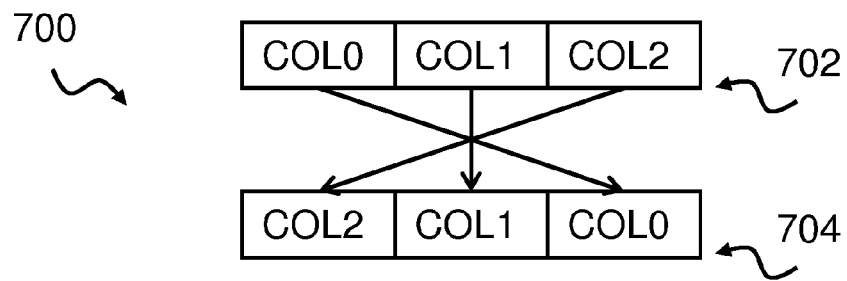
FIG. 7 shows an exemplary mapping of the first sequence of columns as used in the index creation statement to the second sequence of index columns, i.e., the column storage sequence for index columns.

FIG. 7 may again illustrate the different arrangements 700 of the index columns of the index page for the above discussed example and embodiment. The layer 702 may represent the logical sequence defined by the following part of an SQL statement: "CREATE INDEX ix_mytable ON mytable (COL0, COL1, COL2)". The layer 704 may represent the physical storage order or the second sequence of the columns of the same index page. This second sequence may be defined by the following expression of an extended CREATE INDEX SQL statement: "STORED AS (COL2, COL1, COL0)" as shown in a complete form in the text above. The arrows may indicate the re-arranging or conversion.

Figure 8:
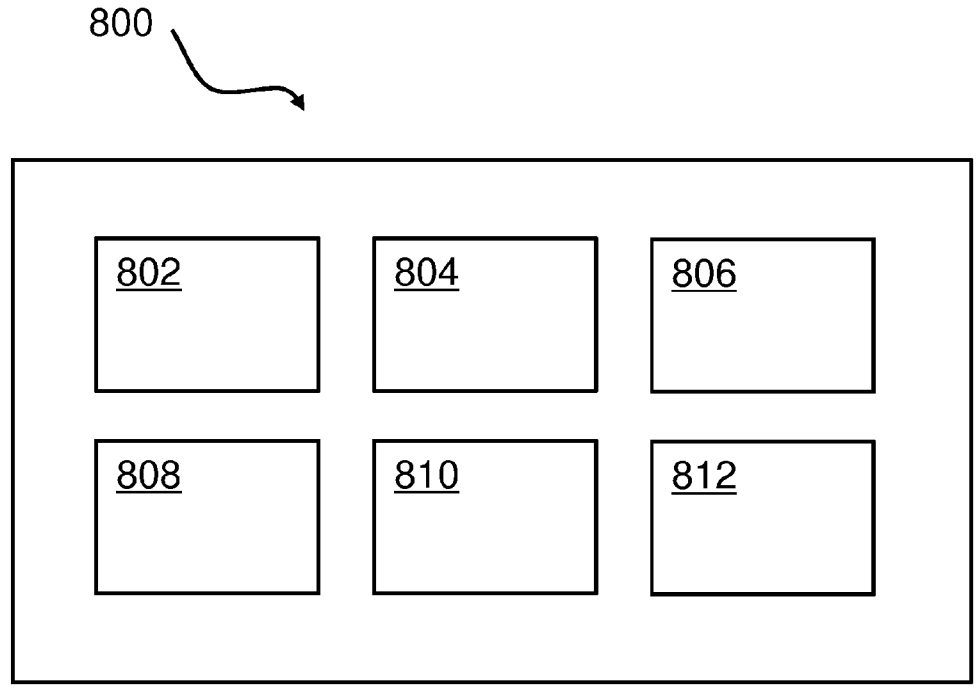
FIG. 8 illustrates an embodiment of an index compression converter.

FIG. 8 may illustrate an embodiment of an index compression converter. An index compression converter 800 for compressing index pages in a database system 920 may comprise a table, wherein the table may comprise table columns. The index compression converter 800 may comprise an index providing unit 802 adapted for providing an index, associated with the table wherein the index may be stored on at least one index page of the database system, and wherein the index comprises index columns related to the table columns. The converter 800 may also comprise a first providing unit 804 adapted for providing a first sequence of the index columns, and a second providing unit 806 adapted for providing a second sequence of the index columns. Furthermore, an arranging unit 808 may be provided, which may be adapted for arranging the index columns stored on the at least one index page according to the second sequence, a compression unit 810 adapted for carrying out a prefix compression on entries of the at least one index page, and an accessing unit 812 adapted for accessing the index using the first sequence of the index columns.

Figure 9:
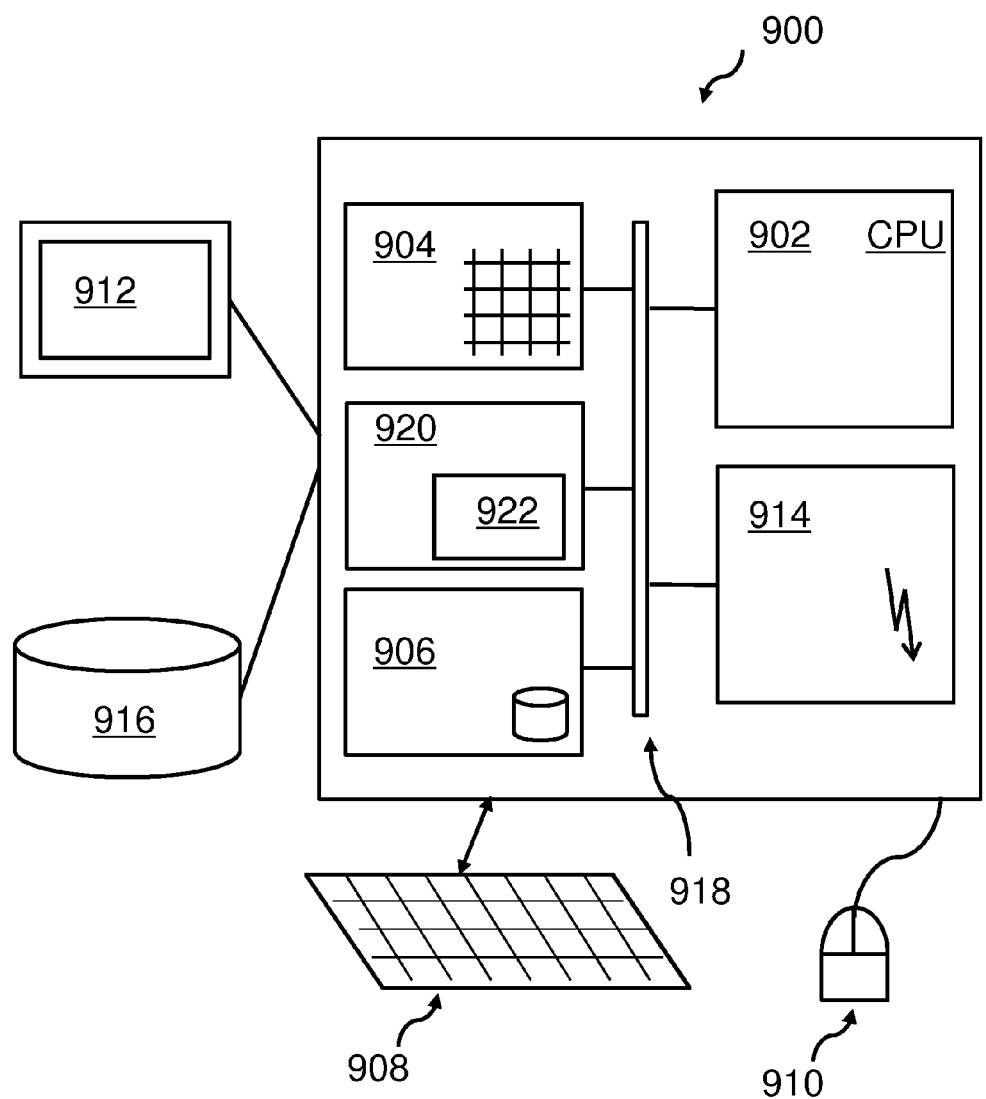
FIG. 9 illustrates a computer system including the inventive index compression converter.

Various embodiments may be implemented on virtually any type of computer, regardless of the platform being used suitable for storing and/or executing program code. For example, as shown in FIG. 9, a computer system 900 may include one or more processor(s) 902 with one or more cores per processor, associated memory elements 904, an internal storage device 906 (e.g., a hard disk, an optical drive such as a compact disk drive or digital video disk (DVD) drive, a flash memory stick, etc.), and numerous other elements and functionalities, typical of today's computers (not shown). The memory elements 904 may include a main memory, e.g., a random access memory (RAM), employed during actual execution of the program code, and a cache memory, which provides temporary storage of at least some program code and/or data in order to reduce the number of times, code and/or data must be retrieved from a long term storage medium or external bulk storage 916 for an execution. Elements inside the computer 900 may be linked together by means of a bus system 918 with corresponding adapters. Additionally, a database system engine 920 including the prefix compression converter 922 may be attached to the bus system 918.

The computer system 900 may also include input means, such as a keyboard 908, a mouse 910, or a microphone (not shown). Furthermore, the computer 900, may include output means, such as a monitor 912 [e.g., a liquid crystal display (LCD), a plasma display, a light emitting diode display (LED), or cathode ray tube (CRT) monitor]. The computer system 900 may be connected to a network, e.g., a local area network (LAN), a wide area network (WAN), such as the Internet or any other similar type of network, including wireless networks via a network interface connection 914. This may allow a coupling to other computer systems or a storage network or a tape drive. Those, skilled in the art will appreciate that many different types of computer systems exist, and the afore-mentioned input and output means may take other forms. Generally speaking, the computer system 900 may include at least the minimal processing, input and/or output means, necessary to practice various embodiments.

Further, those skilled in the art will appreciate that one or more elements of the afore-mentioned computer system 900 may be located at a remote location and connected to the other elements over a network. Further, embodiments may be implemented on a distributed system having a plurality of nodes, where each portion may be located on a different node within the distributed system. In one embodiment, the node corresponds to a computer system. Alternatively, the node may correspond to a processor with associated physical memory. The node may alternatively correspond to a processor with shared memory and/or resources or a smartphone.

Further, software instructions to perform various embodiments may be stored on a computer readable medium, such as a compact disk (CD), a diskette, a tape, or any other computer readable storage device.

In one embodiment, a method for compressing index pages in a database system may be provided. The database system may comprise a table, wherein the table may comprise table columns. The method may comprise providing an index associated with the table, wherein the index may be stored on at least one index page of the database system, and wherein the index may comprise index columns related to a part of the table columns. A first sequence of the index columns may be provided, and a second sequence of the index columns may be provided. Furthermore, the method may comprise arranging the index columns stored on the at least one index page according to the second sequence, carrying out a prefix compression on entries of the at least one index page, and accessing the index using the first sequence of the index columns.

In another embodiment, an index compression converter for compressing index pages in a database system may be provided. The database may comprise a table, wherein the table may comprise table columns. The index compression converter may comprise an index providing unit adapted for providing an index associated with the table, wherein the index may be stored on at least one index page of the database system, and wherein the index may comprise index columns related to a part of the table columns. Furthermore, a first providing unit adapted for providing a first sequence of the index columns, and a second providing unit adapted for providing a second sequence of the index columns may be provided. An arranging unit may be adapted for arranging the index columns stored on the at least one index page according to the second sequence, and a compression unit may be adapted for carrying out a prefix compression on entries of the at least one index page. Moreover, the index compression converter may comprise an accessing unit which may be adapted for accessing the index using the first sequence of the index columns.

The database system may comprise rows and columns and may be a relational database. The index that may be provided may, be created such that the "providing" may become a "creating", in particular based on an SQL statement, or, the index may have been provided earlier, e.g., by an earlier operation in or on the database. The first sequence of the index columns may define a sort criteria for the index entries, whereas the second sequence of index columns may be different to the first sequence of index columns and may, in particular, represent a physical storage sequence, i.e. an index column storage sequence, defining how the index columns may be stored on a long term storage system such as a hard disk in a storage page.

The first sequence may be defined by a traditional "CREATE INDEX" SQL statement relating to the index to be defined. Particularly, only a part of the table columns may be touched by such a sorting. For another part of the columns the "CREATE INDEX" SQL statement may be irrelevant because these other table columns may not be used in the index.

It may also be noted that the second sequence of index columns may be received or may be determined by, e.g., an extended SQL statement. The prefix compression may be carried out before an index page may be stored on a hard disk. The index compression converter may be implemented as a sub-component of a management component of a database system. The database system may be a relational database system.

While limited number of embodiments have been described above, those skilled in the art, having benefit of this disclosure, will appreciate that other embodiments can be devised, which do not depart from the scope as disclosed herein. Accordingly, the scope should be limited only by the attached claims.

It should also be noted that the term "comprising" does not exclude other elements or steps and "a" or "an" does not exclude a plurality. On the other side, the term "comprising" may also include the case of "consisting of". Also, elements described in association with different embodiments may be combined. It should also be noted that reference signs in the claims should not be construed as limiting elements.

What is claimed is:

1. A method for compressing index pages in a database system comprising a table, wherein the table comprises table columns, the method comprising:
    providing an index associated with the table, wherein the index is stored on at least one index page of the database system, wherein the index comprises index columns related to a part of the table columns, wherein the at least one index page is stored on a long term storage medium;
    providing a first sequence of the index columns, wherein the first sequence of the index columns comprises a logical sequence;
    providing a second sequence of the index columns, wherein the second sequence of the index columns comprises a physical sequence that is determined such that an index column having a lowest cardinality is a first column of the index columns in the second sequence;

arranging the index columns stored on the at least one index page stored on the long term storage medium according to the second sequence;

performing a prefix compression on entries of the at least one index page;

transferring the at least one index page from the long term storage medium to a cache;

arranging the index columns according to the first sequence of the index columns such that the index columns are stored in the cache according to the first sequence of the index columns; and accessing the index using the first sequence of the index columns after arranging the index columns according to the first sequence of the index columns in the cache.

2. The method according to claim 1, wherein the accessing of the index comprises arranging the index columns according to the first sequence of the index columns such that entries of the index are accessed using the first sequence of the index columns.

3. The method according to claim 1, wherein the second sequence of the index columns is determined based on data being stored in the table.

4. The method according to claim 1, wherein the providing of the second sequence of the index columns comprises defining the second sequence of the index columns in a modified CREATE INDEX statement of a structured query language.

5. The method according to claim 1, wherein, in case a new row is inserted into the table, a new index entry into the index associated with the table is inserted using the first sequence of the index columns.

6. A computer program product for implementing compressing index pages in a database system comprising a table, wherein the table comprises table columns, the computer program product comprising:

a computer readable storage medium having computer readable program code embodied therewith, the computer readable program code comprising:

computer readable program code configured for:

providing an index associated with the table, wherein the index is stored on at least one index page of the database system, wherein the index comprises index columns related to a part of the table columns, wherein the at least one index page is stored on a long term storage medium;

providing a first sequence of the index columns, wherein the first sequence of the index columns comprises a logical sequence;

providing a second sequence of the index columns, wherein the second sequence of the index columns comprises a physical sequence that is determined such that an index column having a lowest cardinality is a first column of the index columns in the second sequence;

arranging the index columns stored on the at least one index page stored on the long term storage medium according to the second sequence;

performing a prefix compression on entries of the at least one index page;

transferring the at least one index page from the long term storage medium to a cache;

arranging the index columns according to the first sequence of the index columns such that the index columns are stored in the cache according to the first sequence of the index columns; and accessing the index using the first sequence of the index columns after arranging the index columns according to the first sequence of the index columns in the cache.

7. The computer program product according to claim 6, wherein the accessing of the index comprises arranging the index columns according to the first sequence of the index columns such that entries of the index are accessed using the first sequence of the index columns.

8. The computer program product according to claim 6, wherein the second sequence of the index columns is determined based on data being stored in the table.

9. The computer program product according to claim 6, wherein the providing of the second sequence of the index columns comprises defining the second sequence of the index columns in a modified CREATE INDEX statement of a structured query language.

10. The computer program product according to claim 6, wherein, in case a new row is inserted into the table, a new index entry into the index associated with the table is inserted using the first sequence of the index columns.

11. An index compression converter for compressing index pages in a database system comprising a table, wherein the table comprises table columns, the index compression converter comprising:

a computer system comprising a processor and a memory configured to provide:

an index providing unit configured to provide an index associated with the table, wherein the index is stored on at least one index page of the database system, wherein the index comprises index columns related to the table columns, wherein the at least one index page is stored on a long term storage medium;

a first providing unit configured to provide a first sequence of the index columns, wherein the first sequence of the index columns comprises a logical sequence;

a second providing unit configured to provide a second sequence of the index columns, wherein the second sequence of the index columns comprises a physical sequence that is determined such that an index column having a lowest cardinality is a first column of the index columns in the second sequence;

an arranging unit configured to arrange the index columns stored on the at least one index page stored on the long term storage medium according to the second sequence;

a compression unit configured to carry out a prefix compression on entries of the at least one index page;

a transferring unit configured to transfer the at least one index page from the long term storage medium to a cache;

the arranging unit further configured to arrange the index columns according to the first sequence of the index columns such that the index columns are stored in the cache according to the first sequence of the index columns; and an accessing unit configured to access the index using the first sequence of the index columns after arranging the index columns according to the first sequence of the index columns in the cache.

* * * * *